United States Patent
Chang et al.

(10) Patent No.: US 9,032,276 B2
(45) Date of Patent: May 12, 2015

(54) METHOD AND SYSTEM FOR GENERATION OF A TIE-BREAKING METRIC IN A LOW-DENSITY PARITY CHECK DATA ENCODING SYSTEM

(71) Applicant: LSI Corporation, Milpitas, CA (US)

(72) Inventors: Wu Chang, Sunnyvale, CA (US); Fan Zhang, Milpitas, CA (US); Yang Han, Milpitas, CA (US); Ming Jin, Fremont, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 317 days.

(21) Appl. No.: 13/626,255

(22) Filed: Sep. 25, 2012

(65) Prior Publication Data

US 2014/0089767 A1    Mar. 27, 2014

(51) Int. Cl.
| | |
|---|---|
| H03M 13/00 | (2006.01) |
| H03M 13/03 | (2006.01) |
| H04L 27/06 | (2006.01) |
| H03M 13/05 | (2006.01) |
| H03M 13/45 | (2006.01) |
| H03M 13/29 | (2006.01) |
| H03M 13/11 | (2006.01) |
| H03M 13/37 | (2006.01) |
| H03M 13/39 | (2006.01) |
| H03M 13/25 | (2006.01) |

(52) U.S. Cl.
CPC ............ *H03M 13/05* (2013.01); *H03M 13/458* (2013.01); *H03M 13/2948* (2013.01); *H03M 13/1108* (2013.01); *H03M 13/3746* (2013.01); *H03M 13/2975* (2013.01); *H03M 13/3927* (2013.01); *H03M 13/2927* (2013.01); *H03M 13/2957* (2013.01); *H03M 13/258* (2013.01); *H03M 13/1125* (2013.01); *H03M 13/6513* (2013.01); *H03M 13/2963* (2013.01)

(58) Field of Classification Search
CPC ............ H03M 13/05; H03M 13/1108; H03M 13/458; H03M 13/2948; H03M 13/2975; H03M 13/3746; H03M 13/3927; H03M 13/2927; H03M 13/2957; H03M 13/258; H03M 13/2963; H03M 13/6513; H03M 13/1125
USPC ......... 714/780, 785, 786, 794, 795, 797, 799, 714/752; 375/341, 265, 262, 240.24
See application file for complete search history.

(56) References Cited

U.S. PATENT DOCUMENTS

| | | | | |
|---|---|---|---|---|
| 6,014,411 | A | * | 1/2000 | Wang .............................. 375/259 |
| 6,028,897 | A | * | 2/2000 | Wang .............................. 375/265 |
| 6,044,116 | A | * | 3/2000 | Wang .............................. 375/265 |
| 6,230,153 | B1 | | 5/2001 | Howard et al. |
| 7,562,123 | B2 | | 7/2009 | Reich et al. |

(Continued)

OTHER PUBLICATIONS

Zhang et al., A Mutual Information Approach for Comparing LLR Metrics for Iterative Decoders, Jun. 2009, IEEE, pp. 1-5.*

*Primary Examiner* — John J Tabone, Jr.
(74) *Attorney, Agent, or Firm* — Suiter Swantz pc llo

(57) ABSTRACT

The present invention includes generating a tie-breaking metric via a comparative tie-breaking metric training process, monitoring an output of a channel detector in order to identify a tie condition between a first log-likelihood ratio (LLR) value and a second LLR value of a symbol, and upon identifying a tie condition between the first LLR value and the second LLR value of the symbol, applying the generated tie-breaking metric to the symbol in order to assign a hard decision to the symbol.

20 Claims, 7 Drawing Sheets

(56) References Cited

U.S. PATENT DOCUMENTS

| | | | |
|---|---|---|---|
| 7,831,895 B2 * | 11/2010 | Lin | 714/800 |
| 8,069,390 B2 * | 11/2011 | Lin | 714/758 |
| 8,693,588 B2 * | 4/2014 | McCloud et al. | 375/341 |
| 2008/0126908 A1 * | 5/2008 | Lin | 714/758 |
| 2012/0219097 A1 * | 8/2012 | McCloud et al. | 375/341 |

* cited by examiner

US 9,032,276 B2

METHOD AND SYSTEM FOR GENERATION OF A TIE-BREAKING METRIC IN A LOW-DENSITY PARITY CHECK DATA ENCODING SYSTEM

TECHNICAL FIELD

The present invention generally relates to digital signal processing, and, in particular, to the utilization of a tie-breaker metric in a low-density parity check (LDPC) coding setting.

BACKGROUND

As demand for improved communication systems continues to increase so too will the demand for systems and components for reducing noise and error along a communications channel. Typical communications systems include a data source (i.e., transmitter), a communications channel, and a data destination (i.e., receiver). Factors such as noise corruption and channel distortion introduced by a communications channel, such as a hard disk drive (HDD), might be large enough to cause channel error. Channel error may include a scenario where a given receiver interprets the channel output as a value different than the channel input. For instance, the receiver may interpret the channel output as a 0 when in actuality the channel input is a 1, or vice-versa. The existence of channel errors in a communications system reduce throughput along the communications channel.

Low-density parity check (LDPC) coding operations are one means commonly used to detect and eliminate channel errors in a communications system. In this regard, a communications system may include a data encoder, a channel detector and data decoder. The channel detector may receive an encoded codeword from the encoder via the communications channel and then convert the codeword to a set of log-likelihood ratio (LLR) values, each LLR value representing the likelihood of a symbol to be a given value (e.g., 0, 1, 2, or 3). Then, the channel detector may transmit the LLR values to the decoder. The decoder may then perform one or more decoding operations on the received LLR values to generate the decoded codeword. In some settings, a tie is observed on two of the LLR values of a measured symbol, which introduces an additional source of error, thereby further limiting throughput of the communications system. Therefore, it is desirable to provide a method and system suitable for mitigating the impact of the existence of a tie condition at the decoder output of a communications system.

SUMMARY

A method for tie-breaking in an iterative codec environment is disclosed. In one aspect, the method may include, but is not limited to, generating a tie-breaking metric via a comparative tie-breaking metric training process; monitoring an output of a channel detector in order to identify a tie condition between a first log-likelihood ratio (LLR) value and a second LLR value of a symbol; and upon identifying a tie condition between the first LLR value and the second LLR value of the symbol, applying the generated tie-breaking metric to the symbol in order to assign a hard decision to the symbol. In a further aspect, the tie-breaking training process may include acquiring a set of LLR value distributions for a first symbol and a set of LLR value distributions for a second symbol, wherein a true value of the first symbol and a true value of the second symbol are known; comparing the set of LLR value distributions for the first symbol to the set of LLR value distributions for the second symbol in order to identify at least one LLR value distribution of the first symbol different from a corresponding LLR value distribution of the second symbol; generating a tie-breaking rule by comparing the identified LLR value distribution of the first symbol to the corresponding LLR value distribution of the second symbol.

A system for tie-breaking in an iterative codec environment is disclosed. In one aspect, the system may include, but is not limited to, a channel detector configured to receive an encoded codeword from a noisy channel and convert the encoded codeword to a set of log-likelihood ratio (LLR) values, each LLR value having at least a hard decision value; an iterative code decoder; a controller in communication with the channel detector and the iterative code decoder, wherein the controller is configured to: generate a tie-breaking metric via a comparative tie-breaking metric training process; monitor an output of the channel detector in order to identify a tie condition between a first LLR value and a second LLR value of a symbol; assign a hard decision to the symbol based on the generated tie-breaking metric; and transmit the assigned hard decision of the symbol to the iterative code decoder, wherein the iterative code decoder is configured to decode the encoded codeword based on the assigned hard decision of at least the symbol.

A non-transitory computer readable medium storing computer executable instructions which, when executed by one or more processors, cause the one or more processors to carry out a method for tie-breaking in an iterative codec environment is disclosed. In one aspect, the method may include, but is not limited to, generating a tie-breaking metric via a comparative tie-breaking metric training process; monitoring an output of a channel detector in order to identify a tie condition between a first log-likelihood ratio (LLR) value and a second LLR value of a symbol; and upon identifying a tie condition between the first LLR value and the second LLR value of the symbol, applying the generated tie-breaking metric to the symbol in order to assign a hard decision to the symbol.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention. Reference will now be made in detail to the subject matter disclosed, which is illustrated in the accompanying drawings.

Figure 1:
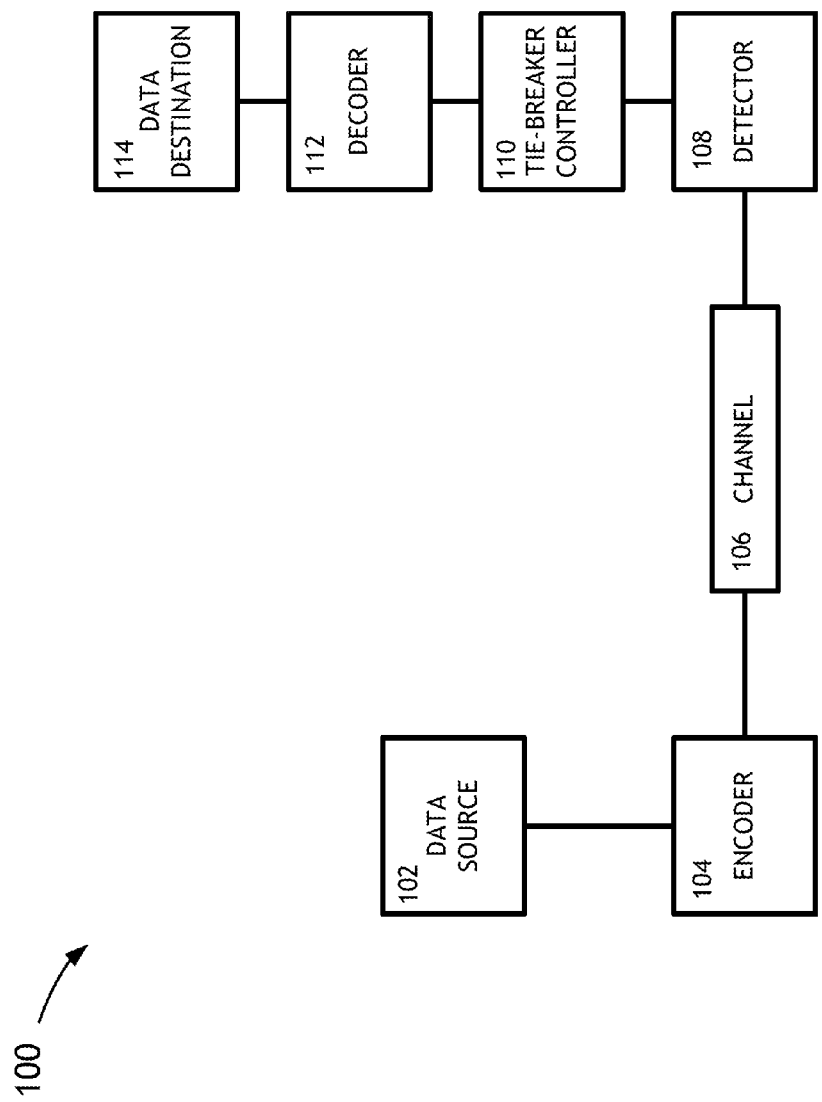
FIG. 1 illustrates a block diagram view of a LDPC based communications system suitable for implementing a tie-breaking procedure, in accordance with one embodiment of the present invention.

Referring generally to FIG. 1, a system 100 for generating and implementing a tie-breaking strategy in an iterative codec environment is described in accordance with the present invention. The present invention is directed to a process and architecture suitable for implementing a probabilistic tie-breaking strategy in a low-density parity check (LDPC) coding environment.

FIG. 1 illustrates a block diagram view of the system 100 for generating and implementing a tie-breaking strategy in an iterative codec environment, in accordance with one embodiment of the present invention. In this regard, a data source 102 may generate sets of bits known as an original information word. Then, an encoder 104 (e.g., LDPC encoder) may encode the original information word to generate a codeword. The encoder 104 then transmits the encoded codeword through a noisy channel 106 (e.g., hard-drive platter). The system 100 may include a channel detector 108 configured to receive an encoded codeword from a noisy channel 106. The detector 108 and encoder 104 may operate on a four element Galois Field (i.e., GF(4)). The channel detector 108 may further be configured to convert the encoded codeword to a set of log-likelihood ratio (LLR) values, each LLR value having an associated hard decision value. A given LLR message may contain four LLR values, namely LLR0, LLR1, LLR2, and LLR3. Each LLR value represents the likelihood of a symbol to be 0, 1, 2, or 3. The hard decision of a symbol is given by "k" when LLR-k is the largest among the four possible LLR values of that symbol. In some instances, a tie is observed on two of the LLR values of a measured symbol, whereby the two LLR values of the symbol are substantially equal in value. Applicant notes that tie conditions between LLR values are observed both in floating point and fixed point LDPC equipped communication systems.

The system 100 may further include a tie-breaker controller 110 suitable for generating and applying a tie-breaking procedure suitable for mitigating the impact of a tie condition on two LLR values of a measured symbol. The controller 110 is in communication with the channel detector 108 and the decoder 112. The controller 110 is configured to: generate a tie-breaking metric via a comparative tie-breaking metric training process; monitor an output of the channel detector in order to identify a tie condition between a first LLR value and a second LLR value of a symbol; assign a hard decision to the symbol based on the generated tie-breaking metric; and transmit the assigned hard decision of the symbol to the iterative code decoder 112.

The system 100 may further include a non-transitory storage medium (not shown) (i.e., memory medium) containing program instructions configured to cause one or more processors of the controller 110 to carry out the various steps described above. Program instructions implementing methods such as those described herein may be transmitted over or stored on a carrier medium. The carrier medium may be a transmission medium such as a wire, cable, or wireless transmission link. The carrier medium may also include a memory medium such as a read-only memory, a random access memory, a magnetic or optical disk, or a magnetic tape. In general, the term "processor" may be broadly defined to encompass any device having one or more processors, which execute instructions from a memory medium. In this sense, the one or more processors may include any microprocessor-type device configured to execute software algorithms and/or instructions. In one embodiment, the one or more processors may consist of a desktop computer or other computer system (e.g., networked computer) configured to execute a program configured to operate one or more components of the system 100, as described throughout the present disclosure. It should be recognized that the steps described throughout the present disclosure may be carried out by a single computer system or, alternatively, multiple computer systems.

In a further aspect, the iterative code decoder 112 is configured to decode the encoded codeword based on the adjusted hard decision of at least the symbol. It is noted herein that correctly determined hard decision values greatly improves the performance of the system decoding process of the system 100 beyond commonly implemented random tie-breaking schemes.

Further, upon receiving the data with assigned hard decisions from the controller 110, the decoder 112 may perform one or more decoding operations in order to generate a decoded correct codeword (DCCW). Then, the decoder 112 may transmit the DCCW to a data destination 114 (e.g., hard disk drive (HDD)). LDPC-based communications systems are generally described in "Turbo-Equalization Methods For Iterative Decoders," U.S. Patent Publication No. 2011/0311002, published on Dec. 22, 2011, and incorporated herein in the entirety.

The embodiments of the system 100 illustrated in FIG. 1 may be further configured as described herein. In addition, the system 100 may be configured to perform any other step(s) of any of the method embodiment(s) described herein.

Figure 2:
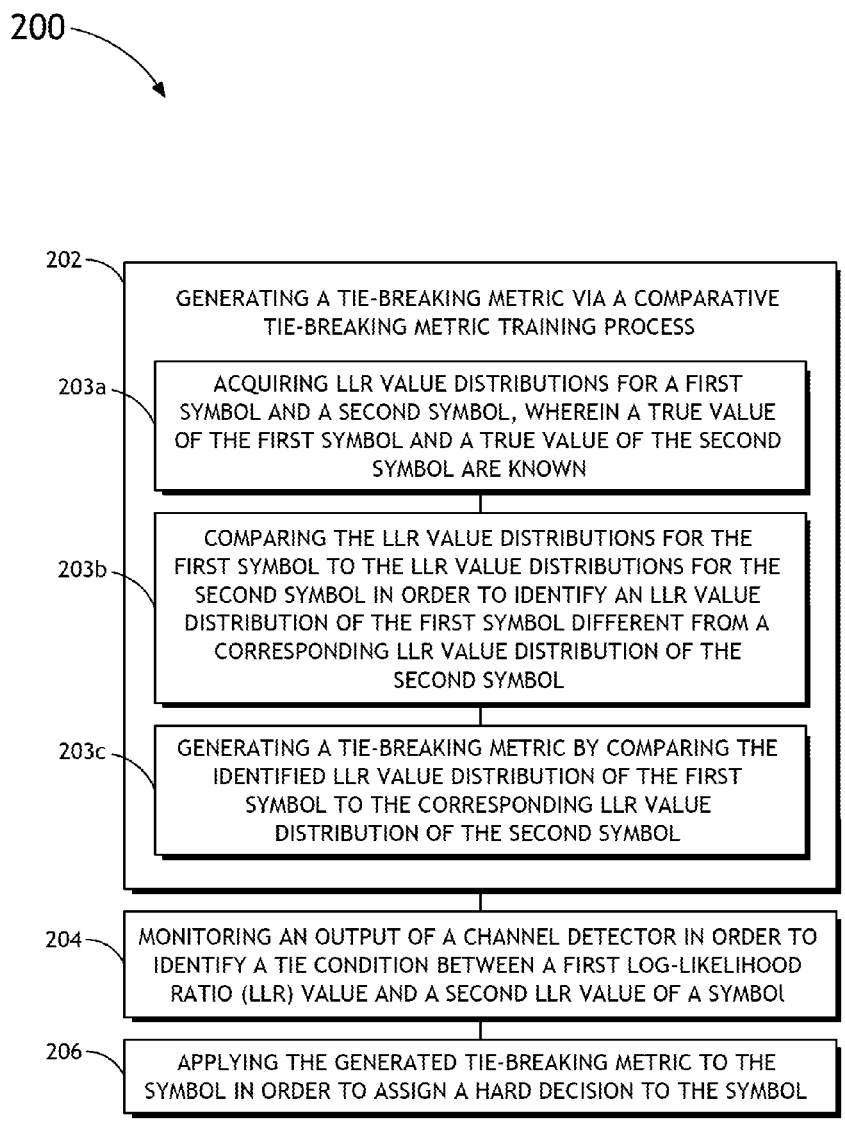
FIG. 2 illustrates a flow chart depicting a method for tie-breaking in an iterative codec environment, in accordance with one embodiment of the present invention.

FIG. 2 illustrates a process flow 200 for implementing a tie-breaking strategy, in accordance with one embodiment of the present invention.

In step 202, a tie-breaking metric is generated via a comparative tie-breaking metric training process. In one aspect, the tie-breaking metric training process may include the step 203a of acquiring a set of LLR value distributions (e.g., LLR0, LLR1, LLR2, LLR2) for a first symbol having a known true value (e.g., true value=0) and a set of LLR value distributions for a second symbol having a known true value (e.g., true value=1). In another aspect, the tie-breaking metric training process may include the step 203b of comparing the set of LLR value distributions for the first true value symbol to the set of LLR value distributions for the second true value symbol in order to identify at least one LLR value distribution of the first true value symbol different from a corresponding LLR value distribution of the second symbol. In another aspect, the tie-breaking metric training process may include the step 203c of generating a tie-breaking metric by comparing the identified LLR value distribution of the first symbol (e.g., LLR3 value associated with true data symbol 0) to the corresponding LLR value distribution of the second symbol (e.g., LLR3 value associated with true data symbol 1). In one embodiment, generating a tie-breaking metric may include determining a threshold LLR value based on a comparison of the identified LLR value distribution of the first known symbol to the corresponding LLR value distribution of the second known symbol.

Figure 3:
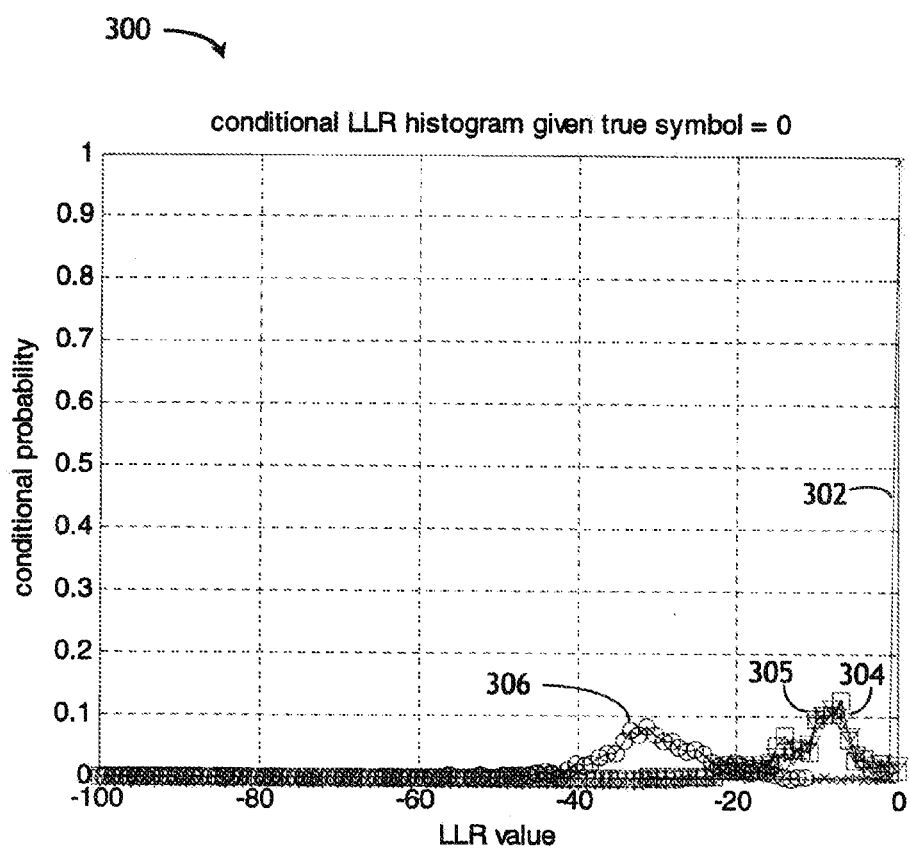
FIG. 3 is a data graph illustrating LLR distributions for a symbol having a true value equal to 0, in accordance with one embodiment of the present invention.
Figure 4:
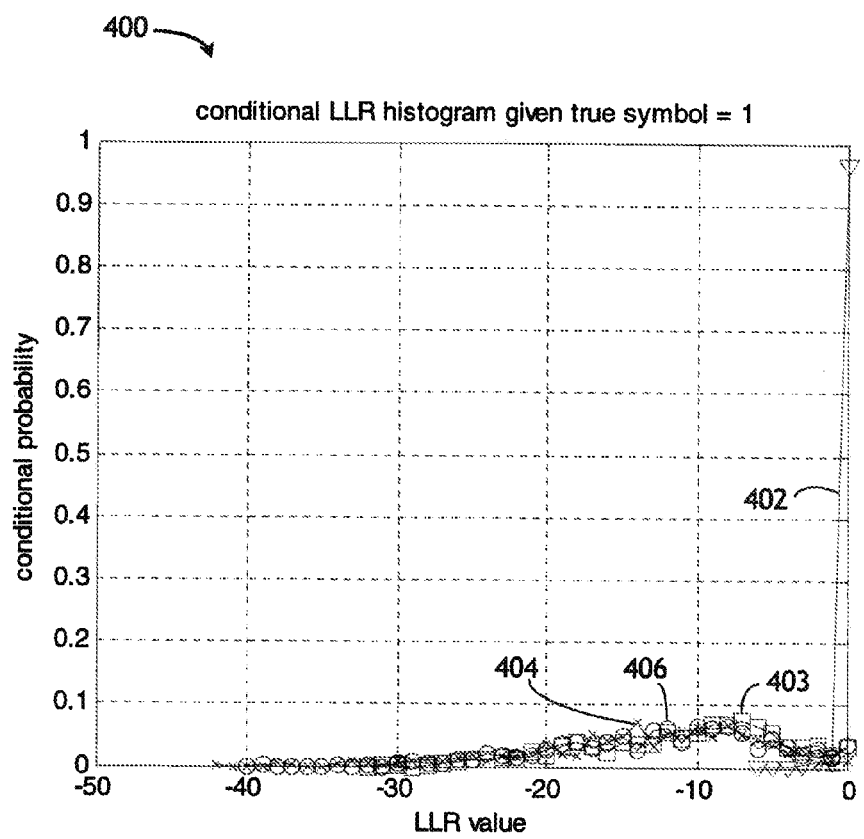
FIG. 4 is a data graph illustrating LLR distributions for a symbol having a true value equal to 1, in accordance with one embodiment of the present invention.

For example, as shown in FIGS. 3 and 4, the system 100 may acquire a set of LLR value distributions for a symbol with true value=0 (see graph 300 of FIG. 3) and a symbol with true value=1 (see graph of FIG. 4). In this regard, the system 100 may acquire LLR distributions of known data being written to a given data destination (e.g., HDD). For instance, FIG. 3 illustrates the conditional LLR distributions of LLR0, LLR1, LLR2, and LLR3 of a symbol having a known true value of 0 captured at the input of the decoder 112. Similarly, FIG. 4 illustrates the conditional LLR distributions of LLR0, LLR1, LLR2, and LLR3 of a symbol having a known true value of 1 captured at the input of the decoder 112. In the case illustrated in FIG. 3 and FIG. 4, it is shown that the symbols 0 and 1 have a tie condition on their LLR values. For instance, for true value=0 shown in FIG. 3, while the LLR0 distribution 302 dominates the other LLR distributions, the LLR1 distribution 304 is also non-zero at the LLR value of 0. Likewise, for true value=1 shown in FIG. 4, while the LLR1 distribution 402 dominates the other LLR distributions, the LLR0 distribution 404 is non-zero at the LLR value of 0, indicating a tie condition between LLR0 and LLR1. Applicants have found that approximately 3 to 5% of the symbols may have a tie condition on their LLR values in this manner.

Utilizing the LLR distributions captured during the training process, the system 100 may identify an LLR distribution that is substantially different (e.g., different in peak location) for true data 0 and true data 1 by comparing the LLR distributions of true data symbol 0 to the LLR distributions of true data symbol 1. For instance, the system 100 may compare distributions of LLR0, LLR1, LLR2, and LLR3 of FIG. 3 to the distributions of LLR0, LLR1, LLR2, and LLR3 of FIG. 4. In the case of a tie on LLR0 and LLR1, the system may compare the distributions of true symbol 0 and true symbol 1, whereby only LLR3 is substantially different between FIG. 3 and FIG. 4. In this regard, the system 100 may utilize the LLR3 distribution of true data symbol 0 and true data symbol 1 to generate a tie-breaking metric.

The system 100 may generate a tie-breaking metric by comparing the LLR3 distribution 306 of true data symbol 0 to the LLR3 distribution 406 of true data symbol 1. As shown in FIGS. 3 and 4, the LLR3 distribution 306 of true data symbol 0 spans from approximately −50 to −18 in LLR value, while the LLR3 distribution 406 of true data symbol 1 spans from approximately −25 to 0 in LLR value. Based on these distributions, a tie-breaker metric used by the system 100 to assign a hard decision for a symbol having a tie on the symbol's LLR0 and LLR1 values may be generated. For instance, the tie-breaker metric may include a threshold value identified by comparing the overlap regions of the LLR3 distribution 306 of true data symbol 0 and the LLR distribution 406 of true data symbol 1. In the case illustrated in FIG. 3 and FIG. 4, the two LLR3 distributions approximately overlap between −25 and −18 in LLR value. The chosen threshold value may then be selected as an LLR value within the overlap LLR3 overlap region (e.g., −25 and −18 in FIG. 3 and FIG. 4). For the purposes of the present disclosure, the threshold value has been selected as −25. Applicants note that the threshold value may include any LLR value within the given overlap region and may be fine tuned based on a trial and error basis. Moreover, it is further noted herein that the manner in which the overlap region is defined may depend on how the extent of the LLR3 distribution is determined along the LLR value axis (i.e., x-axis). In a further aspect, it is recognized that the utilized threshold value may depend on a variety of factors, such as, but not limited to, one or more characteristics of the implemented waveform used to transmit data across the channel 106 and one or more characteristics of the architectural characteristics of the data destination 114 (e.g., real HDD).

Utilizing the identified threshold value described above, the system 100 may generate a tie-breaker metric. For instance, a tie breaker metric for the case described above may consist of the following:

Metric=LLR3−Threshold

In this regard, for a given analyzed symbol (i.e., symbol measured during run phase) the tie-breaker metric is defined by the LLR3 value (e.g., peak position of LLR3 distribution) of the symbol plus the threshold value determined above. In the example described above, with the threshold selected as −25, the tie-breaker metric is given by:

Metric=LLR3+25

In this regard, in settings where an analyzed symbol has a tie-breaker metric less than 0 the symbol is assigned a hard decision of 0. Likewise, in settings where an analyzed symbol has a tie-breaker metric greater than 0, the symbol is assigned a hard decision of 1.

Applicant notes that the foregoing description related to a tie on LLR0 and LLR1 and the corresponding use of LLR3 distributions to generate a tie-breaker metric is not limiting and should be interpreted as merely illustrative. Applicant further notes that the concepts described above may be extended to various other tie condition scenarios, with various LLR distributions being used to generate a tie breaking metric.

Figure 5:
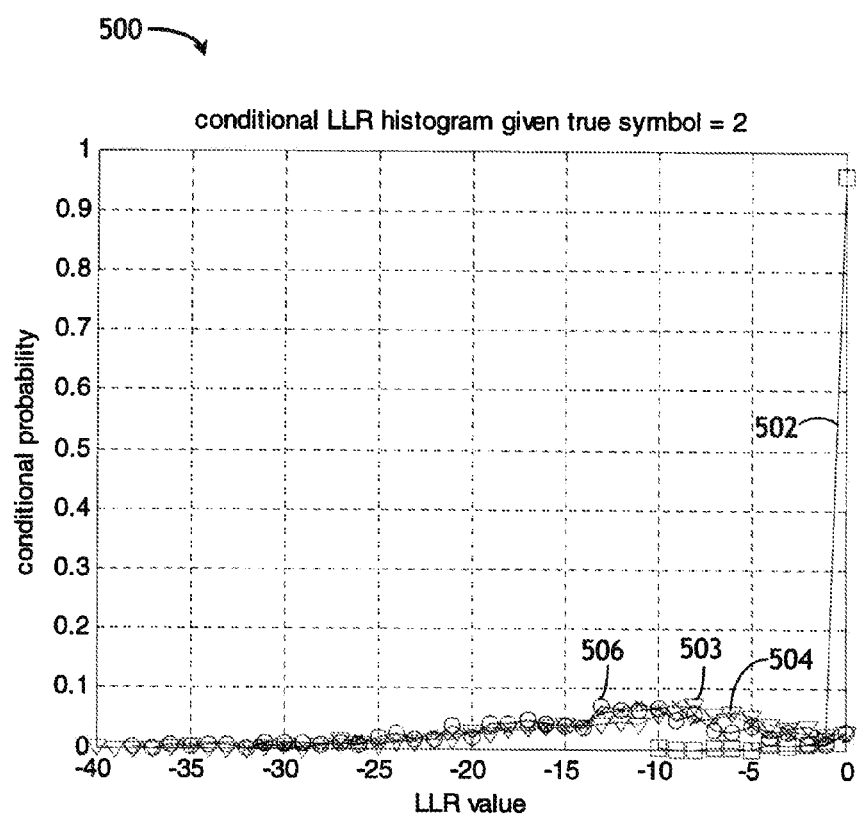
FIG. 5 is a data graph illustrating LLR distributions for a symbol having a true value equal to 2, in accordance with one embodiment of the present invention.

For examples, as shown in FIGS. 3 and 5, the system 100 may acquire a set of LLR value distributions for a symbol with true value=0 (FIG. 3) and a symbol with true value=2 (see graph 500 of FIG. 5). In the case illustrated in FIG. 3 and FIG. 5, it is shown that the symbols 0 and 2 have a tie condition on their LLR values. For instance, for true value=0 shown in FIG. 3, while the LLR0 distribution 302 dominates the other LLR distributions, the LLR2 distribution 305 is also non-zero at the LLR value of 0. Likewise, for true value=2 shown in FIG. 5, while the LLR2 distribution 502 dominates the other LLR distributions at 0, the LLR0 distribution 504 is non-zero at the LLR value of 0, indicating a tie condition between LLR0 and LLR2.

The system 100 may then identify an LLR distribution that is substantially different (e.g., different in peak location) for true data 0 and true data 1 by comparing the LLR distributions of true data symbol 0 to the LLR distributions of true data symbol 2. For instance, the system 100 may compare distributions of LLR0, LLR1, LLR2, and LLR3 of FIG. 3 to the distributions of LLR0, LLR1, LLR2, and LLR3 of FIG. 5. In the case of a tie on LLR0 and LLR2, the system may compare the distributions of true symbol 0 and true symbol 2, whereby, again, only LLR3 is substantially different between FIG. 3 and FIG. 5. In this regard, the system 100 may utilize the LLR3 distribution of true data symbol 0 and true data symbol 2 to generate a tie-breaking metric. In this sense, the tie breaking metric used for the case of a tie on LLR0 and LLR2 of an analyzed symbol is substantially similar to the tie breaking metric derived with regard to a tie on LLR0 and LLR 1 described previously herein. As such, the description related to the development of the tie breaking metric for a tie between 0 and 1 symbols should be interpreted to extend to the setting where a tie condition exists for symbols 0 and 2.

In this regard, in settings where an analyzed symbol has a tie-breaker metric less than 0, the symbol is assigned a hard decision of 0. Likewise, in settings where an analyzed symbol has a tie-breaker metric greater than 0, the symbol is assigned a hard decision of 2.

Figure 6:
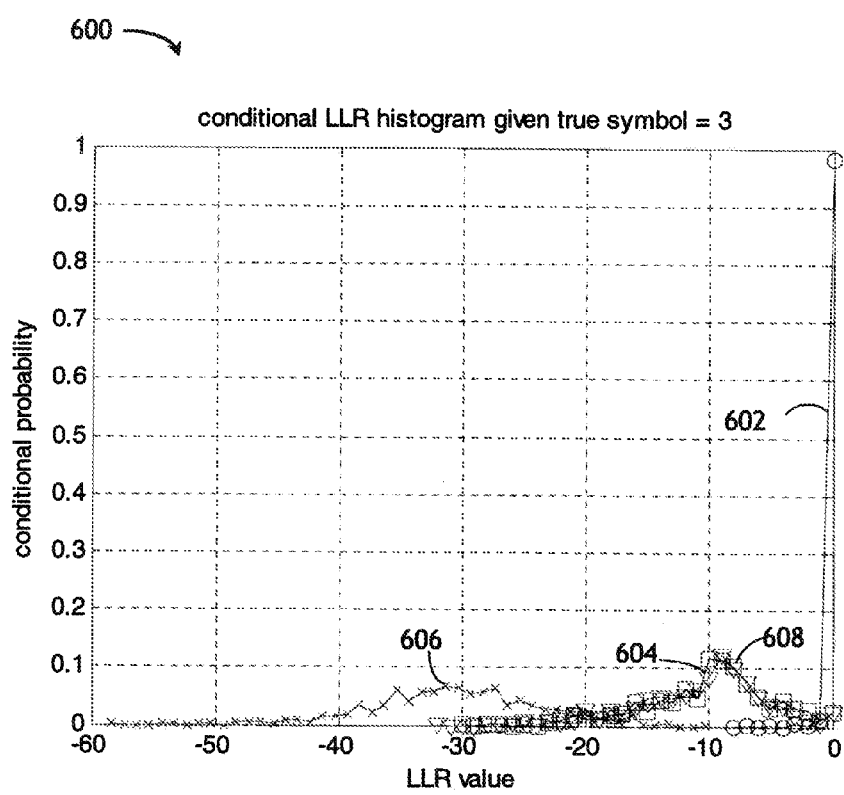
FIG. 6 is a data graph illustrating LLR distributions for a symbol having a true value equal to 3, in accordance with one embodiment of the present invention.

By way of an additional example, as shown in FIGS. 4 and 6, the system 100 may acquire a set of LLR value distributions for a symbol with true value=1 (FIG. 4) and a symbol with true value=3 (see graph 600 of FIG. 6). In the case illustrated in FIGS. 4 and 6, it is shown that the symbols 1 and 3 have a tie condition on their LLR values. For instance, for true value=1 shown in FIG. 4, while the LLR1 distribution 402 dominates the other LLR distributions, the LLR3 distribution 406 is also non-zero at the LLR value of 0. Likewise, for true value=3 shown in FIG. 6, while the LLR3 distribution 602 dominates the other LLR distributions, the LLR1 distribution 604 is non-zero at the LLR value of 0, indicating a tie condition between LLR1 and LLR3.

In a manner to that described previously herein, the system 100 may identify an LLR distribution that is substantially different (e.g., different in peak location) for true data 1 and true data 3 by comparing the LLR distributions of true data symbol 1 to the LLR distributions of true data symbol 3. For instance, the system 100 may compare distributions of LLR0, LLR1, LLR2, and LLR3 of FIG. 4 to the distributions of LLR0, LLR1, LLR2, and LLR3 of FIG. 6. In the case of a tie on LLR1 and LLR3, the system may compare the distributions of true symbol 1 and true symbol 3, whereby only LLR0 (curve 606 in FIG. 6 and curve 404 in FIG. 4) is substantially different between FIG. 4 and FIG. 6. In this regard, the system 100 may utilize the LLR0 distribution of true data symbol 1 and true data symbol 3 to generate a tie-breaking metric.

Similar to the procedure described above regarding a tie on LLR0 and LLR1, the system 100 may generate a tie-breaking metric by comparing the LLR0 distribution 404 of true data symbol 1 to the LLR0 distribution 606 of true data symbol 3. Based on these distributions, a tie-breaker metric used by the system 100 to assign a hard decision for a symbol having a tie on the symbol's LLR1 and LLR3 values may be generated. For instance, the tie-breaker metric may include a threshold value identified by comparing the overlap regions of the LLR0 distribution 404 of true data symbol 1 and the LLR distribution 606 of true data symbol 3. In the case illustrated in FIG. 4 and FIG. 6, the threshold value may be selected as −25. Applicants again note that the threshold value may include any LLR value within the given overlap region and may be fine tuned based on a trial and error basis.

The tie breaker metric for the case of a tie between LLR1 and LLR3 described above may consist of the following:

Metric=LLR0−Threshold

In this regard, for a given analyzed symbol (i.e., symbol measured during run phase) the tie-breaker metric is defined by the LLR0 value (e.g., peak position of LLR0 distribution) of the symbol plus the threshold value determined above. In the example described above, with the threshold selected as −25, the tie-breaker metric is given by:

Metric=LLR0+25

In this regard, in settings where an analyzed symbol has a tie-breaker metric less than 0 the symbol is assigned a hard decision of 3. Likewise, in settings where an analyzed symbol has a tie-breaker metric greater than 0, the symbol is assigned a hard decision of 1.

Applicant notes that the foregoing description related to a tie on LLR1 and LLR3 and the corresponding use of LLR0 distributions to generate a tie-breaker metric is not limiting and should be interpreted as merely illustrative.

In an additional example, as shown in FIGS. 5 and 6, the system 100 may acquire a set of LLR value distributions for a symbol with true value=2 (FIG. 5) and a symbol with true value=3 (FIG. 6). In the case illustrated in FIG. 5 and FIG. 6, it is shown that the symbols 2 and 3 have a tie condition on their LLR values. For instance, for true value=2 shown in FIG. 5, while the LLR2 distribution 502 dominates the other LLR distributions, the LLR3 distribution 506 is also non-zero at the LLR value of 0. Likewise, for true value=3 shown in FIG. 6, while the LLR3 distribution 602 dominates the other LLR distributions at 0, the LLR2 distribution 608 is non-zero at the LLR value of 0, indicating a tie condition between LLR2 and LLR3.

The system 100 may then identify an LLR distribution that is substantially different (e.g., different in peak location) for true data 2 and true data 3 by comparing the LLR distributions of true data symbol 2 to the LLR distributions of true data symbol 3. For instance, the system 100 may compare distributions of LLR0, LLR1, LLR2, and LLR3 of FIG. 5 to the distributions of LLR0, LLR1, LLR2, and LLR3 of FIG. 6. In the case of a tie on LLR2 and LLR3, the system may compare the distributions of true symbol 2 and true symbol 3, whereby, again, only LLR0 is substantially different between FIG. 5 and FIG. 6. In this regard, the system 100 may utilize the LLR0 distribution of true data symbol 2 and true data symbol 3 to generate a tie-breaking metric. In this sense, the tie breaking metric used for the case of a tie on LLR2 and LLR3 of an analyzed symbol is substantially similar to the tie breaking metric derived with regard to a tie on LLR1 and LLR 3 described previously herein. As such, the description related to the development of the tie breaking metric for a tie between 1 and 3 symbols should be interpreted to extend to the setting where a tie condition exists for symbols 2 and 3.

In this regard, in settings where an analyzed symbol has a tie-breaker metric less than 0, the symbol is assigned a hard decision of 3. Likewise, in settings where an analyzed symbol has a tie-breaker metric greater than 0, the symbol is assigned a hard decision of 2.

Applicant notes that based on the LLR distributions obtained for the true values 0, 1, 2, and 3 as shown in FIGS. 3-6, the system 100 will not detect a tie condition between symbols 0 and 3, as a tie condition does not exist between LLR0 and LLR3, as observed in graph 300 of FIG. 3 and graph 600 of FIG. 6.

In addition, since the true data symbols 1 and 2 both display substantially identical distributions for LLR0 and LLR3 the tie breaking metric as described above may not be generated. However, since the LLR0 and LLR3 distributions are nearly identical for both true data symbols 1 and 2 there is an equal probability that a symbol showing a tie condition on LLR1 and LLR2 is 1 or 2. As such, a LLR1/LLR2 tie condition in a symbol may be broken randomly.

In a further aspect, the various tie-breaker metrics described above may be aggregated into a single database and utilized by the system 100 at a later time when needed (e.g., during a running phase of the HDD). For example, the various tie-breaker metrics and conditions may be aggregated into a tabular format such as that provided in Table 1 below:

| Tie Condition | 0:1 | 0:2 | 0:3 | 1:2 | 1:3 | 2:3 |
|---|---|---|---|---|---|---|
| Metric | LLR3 + 25 | LLR3 + 25 | n/a | n/a | LLR0 + 25 | LLR0 + 25 |
| HD if <0 | 0 | 0 | n/a | random | 3 | 3 |
| HD if >0 | 1 | 2 | n/a | random | 1 | 2 |

Referring again to process flow 200 of FIG. 2, in step 204, an output of a channel detector is monitored in order to identify a tie condition between a first LLR value and a second LLR value of a symbol. For example, during operation of the data destination 114 of the system 100, such as running of the real HDD of the system 100, the controller 110 may monitor an output of the channel detector 108 in order to identify a tie condition in symbols. In this regard, the controller 110 is configured to detect ties in the LLR distributions in the symbols monitored by the controller 110. It is further recognized that the controller 110 may be configured to obtain the LLR values for each monitored symbol in any manner known in the art.

For example, the controller 110 may identify a tie condition between LLR0 and LLR1 values on a given symbol, indicating that the symbol may have a hard decision of either 0 or 1, depending on the outcome of applied tie breaking rule.

In step 206, upon identification of a tie condition between the first LLR value (e.g., LLR0) and the second LLR (e.g., LLR1) value of the symbol, the generated tie-breaking metric may be applied to the symbol in order to assign a hard decision to symbol. For example, as discussed previously herein and summarized in table 1, in settings where a tie condition exists between LLR0 and LLR1, a generated tie-breaker metric less than 0 causes the controller 110 to assign the given symbol a hard decision of 0. Further, a generated tie-breaker metric greater than 0 causes the controller 110 to assign the given symbol a hard decision of 1. It is further anticipated that any of the tie-breaker metric relationships described above may be used to assign hard decision values to the monitored symbols.

In a further aspect, the decoder 112 of the system 100 may decode the given codeword transmitted along the noisy channel 106 based on the assigned hard decisions arrived at via the application of the tie-breaking metric described above. Further, the decoder 112 may then transmit the decoded data to a given data destination 114, such as a HDD.

Figure 7:
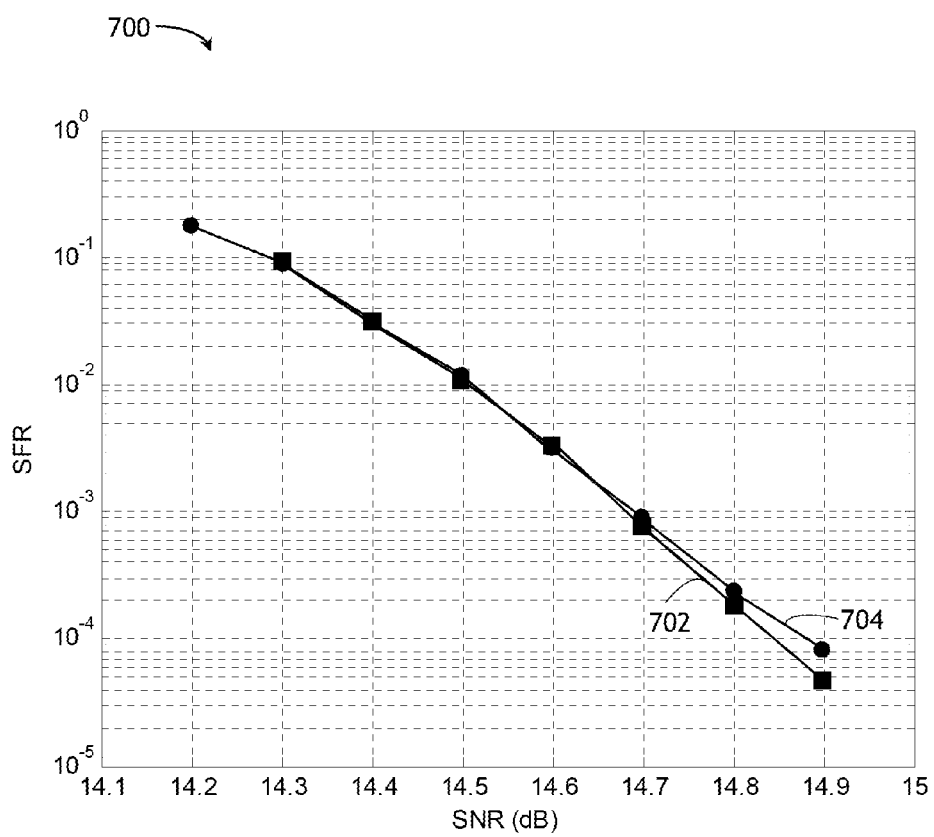
FIG. 7 is a data graph illustrating the effectiveness of a tie-breaking procedure, in accordance with one embodiment of the present invention.

FIG. 7 illustrates a set of simulation results illustrating the effectiveness of the tie-breaking procedure of the present invention. The Graph 700 illustrates simulated SFR versus SNR data sets for the tie-breaking implementation 702 and a reference implementation 704 (i.e., no tie-breaking procedure). Specifically, Graph 700 of FIG. 7 illustrates a floating point simulation utilizing a backend waveform model with 90% jitter noise and 10% AWGN. The simulation illustrates a 0.02 dB gain achieved at $10^{-4}$ SFR. It is anticipated that a larger gain will exist at higher SNR. As such, it is evident that the tie-breaking procedure of the present invention aids improving signal quality in the LDPC decoding setting of the present invention.

Applicant notes that the above ordering of steps should not be interpreted as limiting. It is anticipated that at least a portion of the steps of process 200 may be carried out in a different order.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. Furthermore, it is to be understood that the invention is defined by the appended claims.

What is claimed:

1. A method for tie-breaking in an iterative codec environment, comprising:
generating a comparative tie-breaking metric via a comparative tie-breaking metric training process, wherein the comparative tie-breaking metric training process includes comparing a first acquired log-likelihood ratio (LLR) value distribution to at least a second acquired LLR value distribution;
monitoring an output of a channel detector in order to identify a tie condition between a first LLR value and a second LLR value of a symbol; and
upon identifying a tie condition between the first LLR value and the second LLR value of the symbol, applying the generated comparative tie-breaking metric to the symbol in order to assign a hard decision to the symbol.

2. The method of claim 1, wherein the comparative tie-breaking metric training process comprises:
acquiring a set of LLR value distributions for a first symbol and a set of LLR value distributions for a second symbol, wherein a true value of the first symbol and a true value of the second symbol are known;
comparing the set of LLR value distributions for the first symbol to the set of LLR value distributions for the second symbol in order to identify at least one LLR value distribution of the first symbol different from a corresponding LLR value distribution of the second symbol; and
generating a comparative tie-breaking metric by comparing the identified LLR value distribution of the first symbol to the corresponding LLR value distribution of the second symbol.

3. The method of claim 2, wherein the generating a comparative tie-breaking metric by comparing the identified LLR value distribution of the first symbol to the corresponding LLR value distribution of the second symbol comprises:
determining a tie-breaking threshold by comparing the identified LLR value distribution of the first symbol to the corresponding LLR value distribution of the second symbol.

4. The method of claim 1, wherein the comparative tie-breaking metric is a function of an implemented waveform.

5. The method of claim 1, wherein the comparative tie-breaking metric is a function of one or more architectural characteristics.

6. The method of claim 1, further comprising:
transmitting the assigned hard decision of the symbol to an iterative code decoder.

7. The method of claim 6, further comprising:
decoding an encoded codeword based on the assigned hard decision of at least the symbol.

8. A system for tie-breaking in an iterative codec environment, comprising:
a channel detector configured to receive an encoded codeword from a noisy channel and convert the encoded codeword to a set of log-likelihood ratio (LLR) values, each LLR value having at least a hard decision value;
an iterative code decoder; and
a controller in communication with the channel detector and the iterative code decoder, wherein the controller is configured to:
generate a comparative tie-breaking metric via a comparative tie-breaking metric training process, wherein the comparative tie-breaking metric training process includes comparing a first acquired log-likelihood ratio (LLR) value distribution to at least a second acquired LLR value distribution;
monitor an output of the channel detector in order to identify a tie condition between a first LLR value and a second LLR value of a symbol;
assign a hard decision to the symbol based on the generated comparative tie-breaking metric; and
transmit the assigned hard decision of the symbol to the iterative code decoder,
wherein the iterative code decoder is configured to decode the encoded codeword based on the assigned hard decision of at least the symbol.

9. The system of claim 8, wherein the comparative tie-breaking metric training process comprises:
acquiring a set of LLR value distributions for a first symbol and a set of LLR value distributions for a second symbol, wherein a true value of the first symbol and a true value of the second symbol are known;
comparing the set of LLR value distributions for the first symbol to the set of LLR value distributions for the second symbol in order to identify at least one LLR value distribution of the first symbol different from a corresponding LLR value distribution of the second symbol;
generating a comparative tie-breaking metric by comparing the identified LLR value distribution of the first symbol to the corresponding LLR value distribution of the second symbol.

10. The system of claim 9, wherein the generating a comparative tie-breaking metric by comparing the identified LLR value distribution of the first symbol to the corresponding LLR value distribution of the second symbol comprises:
determining a tie-breaking threshold by comparing the identified LLR value distribution of the first symbol to the corresponding LLR value distribution of the second symbol.

11. The system of claim 8, wherein the comparative tie-breaking metric is a function of an implemented waveform.

12. The system of claim 8, wherein the comparative tie-breaking metric is a function of one or more architectural characteristics.

13. The system of claim 8, wherein the iterative decoder is configured to perform low-density parity check (LDPC) decoding.

14. A non-transitory computer readable medium storing computer executable instructions which, when executed by one or more processors, cause the one or more processors to carry out a method for tie-breaking in an iterative codec environment, comprising:
generating a comparative tie-breaking metric via a comparative tie-breaking metric training process, wherein the comparative tie-breaking metric training process includes comparing a first acquired log-likelihood ratio (LLR) value distribution to at least a second acquired LLR value distribution;
monitoring an output of a channel detector in order to identify a tie condition between a first log LLR value and a second LLR value of a symbol; and
upon identifying a tie condition between the first LLR value and the second LLR value of the symbol, applying the generated comparative tie-breaking metric to the symbol in order to assign a hard decision to the symbol.

15. The non-transitory computer readable medium of claim 14, wherein the comparative tie-breaking metric training process comprises:

acquiring a set of LLR value distributions for a first symbol and a set of LLR value distributions for a second symbol, wherein a true value of the first symbol and a true value of the second symbol are known;

comparing the set of LLR value distributions for the first symbol to the set of LLR value distributions for the second symbol in order to identify at least one LLR value distribution of the first symbol different from a corresponding LLR value distribution of the second symbol;

generating a comparative tie-breaking metric by comparing the identified LLR value distribution of the first symbol to the corresponding LLR value distribution of the second symbol.

16. The non-transitory computer readable medium of claim 15, wherein the generating a comparative tie-breaking metric by comparing the identified LLR value distribution of the first symbol to the corresponding LLR value distribution of the second symbol comprises:

determining a tie-breaking threshold by comparing the identified LLR value distribution of the first symbol to the corresponding LLR value distribution of the second symbol.

17. The non-transitory computer readable medium of claim 14, wherein the comparative tie-breaking metric training process is a function of an implemented waveform.

18. The non-transitory computer readable medium of claim 14, wherein the comparative tie-breaking metric training process is a function of one or more architectural characteristics.

19. The non-transitory computer readable medium of claim 14, further comprising:

transmitting the assigned hard decision of the symbol to an iterative code decoder.

20. The non-transitory computer readable medium of claim 14, further comprising:

decoding an encoded codeword based on the assigned hard decision of at least the symbol.

* * * * *